United States Patent [19]

David et al.

[11] Patent Number: 5,700,517
[45] Date of Patent: Dec. 23, 1997

[54] PROCESS FOR THE DENSIFICATION OF A POROUS STRUCTURE BY BORON NITRIDE

[75] Inventors: Patrick David, Paris; Jean D. Benazet, Bretigny; Bruno Narcy, Montreuil, all of France

[73] Assignee: Commissariat a l'Energie Atomique, Paris, France

[21] Appl. No.: 648,143

[22] PCT Filed: Nov. 24, 1994

[86] PCT No.: PCT/FR94/03171

§ 371 Date: May 24, 1996

§ 102(e) Date: May 24, 1996

[87] PCT Pub. No.: WO95/14645

PCT Pub. Date: Jun. 1, 1995

[30]    Foreign Application Priority Data

Nov. 26, 1993   [FR]   France ................... 93 14182

[51] Int. Cl.⁶ .................... C04B 35/5835; B05D 3/02
[52] U.S. Cl. .................... 427/226; 501/96.4; 501/99; 501/127
[58] Field of Search .................... 501/96, 92, 98, 501/99, 127; 427/226

[56]            References Cited

U.S. PATENT DOCUMENTS

| 4,655,893 | 4/1987 | Beale | 427/569 |
| 4,971,779 | 11/1990 | Paine, Jr. et al. | 501/96 |
| 5,082,693 | 1/1992 | Paine, Jr. et al. | 427/226 |
| 5,188,757 | 2/1993 | Paine, Jr. et al. | 252/183.11 |
| 5,204,295 | 4/1993 | Paine, Jr. et al. | 501/96 |

OTHER PUBLICATIONS

Journal Of Composite Materials, vol. 9, Jul. 1975, pp. 228–240, H. O. Pierson "Boron Nitride Composites by Chemical Vapor Deposition".

Proceedings Of The 4TH CVD Conference, 1973, pp. 460–472, J. J. Gebhardt, "CVD Boron Nitride Infiltration of Fibrous Structures: Properties of Low Temperature Deposits" No month.

Chemical Abstracts, vol. 106, No. 14, 6 Apr. 1987, Columbus, Ohio, US; Abstract No. 106847d, H. Tanji, et al., p. 298 and JP A 61 236 672 (ID).

Chemical Abstracts, vol. 104, No. 20, 19 May 1986, Columbus, Ohio, US; Abstract No. 173212q, Y. Hoshino, p. 293 and JP A 61 010 090 (ID).

Chemical Abstracts, vol. 115, No. 10, 9 Sep. 1991, Columbus, Ohio, US; Abstract No. 103333h, M. Nishimura et al., p. 761 and JP A 0 364 475 (ID).

*Primary Examiner*—Karl Group
*Attorney, Agent, or Firm*—Pearne, Gordon, McCoy & Granger LLP

[57]            ABSTRACT

A process for densifying a porous structure with boron nitride includes placing the porous structure in a borazene precursor of the formula RBNH wherein R is a halogen or hydrogen, heating by induction at a pressure of at least $1.2 \times 10^5$ Pa and thereby decomposing the precursor to form boron nitride that is deposited within the pores of the porous structure.

5 Claims, 2 Drawing Sheets

PROCESS FOR THE DENSIFICATION OF A POROUS STRUCTURE BY BORON NITRIDE

BACKGROUND OF THE INVENTION AND RELATED ART

The present invention relates to a process for the densification of a porous structure by boron nitride e.g. making it possible to densify bidirectional multidirectional felts or fabrics, or porous ceramics. The densification consists of filling the gaps of the porous matrix so as to bring about an increase in the density thereof.

The invention also relates to a porous structure densified by boron nitride.

Boron nitride has the following particularly interesting properties:

lightness, excellent chemical inertia, i.e. resistance to acids and molten melts and absence of a chemical reaction with carbon or carbon dioxide up to 1800° C., good thermal stability (up to 2200° C. under an inert atmosphere and up to 2400° C. under nitrogen), good behaviour during ablation, good heat conductor, high electrical resistivity, and good mechanical properties.

As a result of these specific properties, boron nitride is conventionally used in the construction of vacuum furnaces used at high temperatures, in the foundry field, in processes for the transformation of very pure metals or alloys in order to bring about a continuous casting of steels. It is also used in the coating of carbon fibres in order to protect them against oxidation or serving as an adaptation interface between the fibres and the ceramic composite matrixes.

Boron nitride is potentially usable for other very important applications in the aeronautical or space fields, e.g. in the manufacture of antenna windows, aircraft brakes, thermal shields or reentry vehicles (into the atmosphere) of a dielectric nature. Thus, boron nitride oxidizes much less rapidly than carbon-carbon matrixes and constitutes a very good electrical insulator. However, for said latter applications, boron nitride in ceramic form is not suitable, due to its excessive brittleness with respect to thermal or mechanical shocks. To obviate this problem, it is necessary to have materials in the form of composites incorporating a matrix reinforced by woven fibres, as is already the case for most non-metallic compounds of the carbon, carbide, boride, nitride or oxide type.

Several procedures have been studied in the prior art for producing composite materials having a boron nitride matrix.

Thus, a first method is known using the gaseous procedure or vapour phase chemical infiltration. This method has been industrially developed for carbon and silicon carbide and consists of chemically reacting by heating gaseous species within a porous network known as a preform. This method suffers from numerous disadvantages. It is difficult to obtain a high, homogeneous densification, because it is necessary to avoid the premature closure of the pores located at the periphery of the part to be densified. In addition, this method is extremely slow and production periods of several months are required for large parts.

Among the vapour deposition methods, the article by J. J. GEBHARDT, "Proceedings of the 4th CVD Conference", 1973, pp 460–472 discloses a process for densifying fibrous structures of silica and boron nitride by vapour thermal decomposition of a boron nitride precursor. This precursor is e.g. trichloroborazene $(BClNH)_3$. According to this document, the porous preform is placed within an enclosure into which the trichloroborazene is introduced in gaseous form, at a temperature of approximately 1100° C. and under a pressure of $4 \times 10^2$ Pa. The article also states that attempts to infiltrate boron nitride at higher pressures and temperatures rapidly leads to the sealing of the external pores of the preform and limits the penetration of the precursor and boron nitride into the porous structure.

The article by Hugues H. PIERSON, "Boron Nitride Composites by Chemical Vapor Deposition", J. Composite Materials, vol. 9, July 1975, pp 228–240, describes a composite material formed by chemical vapour deposition of boron nitride on a substrate based on boron nitride fibres. The reactive gases used are boron trifluoride $(BF_3)$ and ammonia $(NH_3)$. According to this article, a preform formed by a boron nitride felt is introduced into a CVD enclosure, in the centre of a graphite susceptor. Induction heating coils are placed in the enclosure walls, said enclosure being supplied by the two aforementioned gases. The reaction temperature is between 1100° and 1200° C. and the pressure maintained within the enclosure varies between 40 and $53 \times 10^2$ Pa. In this way the preform is densified.

However, the materials obtained by the two aforementioned processes suffer from defects and in particular a low density and the inclusion of not entirely pyrolyzed compounds. In addition, said composite materials have cracks.

A second densification procedure consists of carrying out a solid phase reaction. This is described in the article by Ruey Y. LIN, James ECONOMY and H. DEAN BATHA, "Preparation of BN/BN Composites", Ceramic Bulletin, vol. 55, No. 9, 1976. The process described in this article consists of mixing boron nitride fibres with a partly nitrided precursor constituted by a mixture of boron nitride and boron oxide $B_2O_3$ in fibrous form, followed by hot isostatic pressing or compression.

Finally, French patent application 2 684 366 discloses a process for the preparation of boron nitride by the reaction of trichloroborazene with a derivative of formula $N_2Si_n(CH_3)_{3n}H_{4-n}$ (n being equal to 2 or 3), followed by pyrolysis. However, there is no passage to the vapour phase during pyrolysis.

SUMMARY OF THE INVENTION

The invention aims at obviating the disadvantages of the prior art.

The invention therefore relates to a process for the densification of a porous structure by boron nitride, characterized in that the porous structure is placed in a precursor chosen from among borazenes of formula RBNH, in which R is a halogen or hydrogen and in that heating takes place by induction at a temperature of at least 600° C., under a pressure of at least $1.2 \times 10^5$ Pa, so as to form, by decomposition of the precursor, boron nitride which can be deposited within the pores of said porous structure.

As a result of these features of the invention, the process makes it possible to densify porous structures within a very short time of a few hours, whereas all the prior art processes only permitted densification after several days or even several weeks. Moreover, this process makes it possible to obtain a porous structure having a high density and products free from cracks. The use of a high pressure avoids the decomposition of the precursor in the reactor and permanently maintains precursor within said reactor.

Preferably, the chosen precursor is trichloroborazene $(BClNH)_3$.

The invention also relates to a porous structure densified by boron nitride, in which the boron nitride has a graphite-type structure, a crystallite size $L_a$ between 50 and 100 nm, $L_c$ between 10 and 20 nm and an interplane distance $d_{oo2}$ between 33.3 and $3.37 \cdot 10^{-10}$ m (3.33 and 3.37 Å).

BRIEF DESCRIPTION OF THE DRAWINGS

Other features and advantages of the invention can be gathered from the following non-limitative description with reference to the attached drawings, wherein show.

DETAILED DESCRIPTION OF THE PREFERRED EMBODIMENTS

According to the invention, the process consists of placing a porous structure having a random shape in a boron nitride precursor, heating by induction under pressure, so as to form boron nitride which can be deposited within the pores of the porous structure.

This process can be used for densifying substrates of e.g. carbon, graphite, alumina or boron nitride. In more general terms, the porous structure can be of a random chemical nature, but is stable at the operating temperature of the process.

The selected boron nitride precursor corresponds to the family of borazenes of formula $(RBNH)_3$ in which R is a halogen or hydrogen. This precursor family makes it possible to obtain pure boron nitride. Advantageously, the precursor is trichloroborazene.

Borazenes are compounds which decompose and polymerize rapidly when brought to the boiling temperature. Consequently it is necessary to carry out the reaction under pressure so as to greatly reduce the decomposition of the precursor. Crystallization of the precursor is avoided by increasing the boiling temperature.

The densification reaction is performed at a temperature of at least 600° C. and preferably at least approximately 1000° C., under a pressure of at least $1.0 \times 10^5$ Pa and preferably at least $1.4 \times 10^5$ Pa. The higher the temperature, the higher the densification speed. Below a pressure of $1.2 \times 10^5$ Pa, the precursor very rapidly decomposes, which leads to its disappearance and to the stoppage of the densification process after a few minutes.

Figure 1:
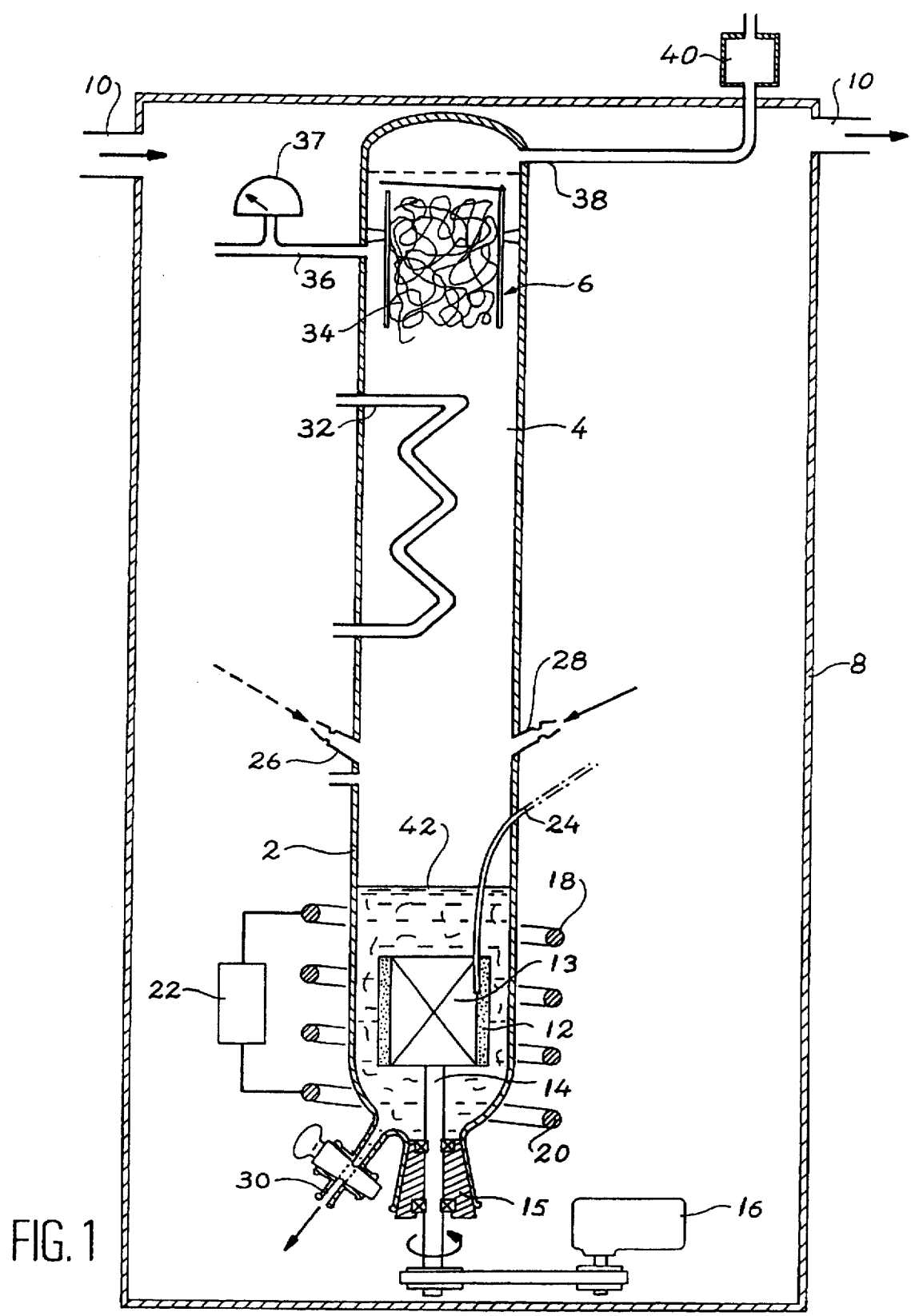
FIG. 1 Diagrammatically an apparatus permitting the performance of the process according to the invention.

FIG. 1 illustrates an apparatus usable for performing the process according to the invention. This apparatus is in three parts, namely a reactor 2, a heat exchanger or condenser 4 and a splash head 6 or aerosol trap. This apparatus is placed within a glove box 8, provided with inlets and outlets 10 permitting the scavenging of the interior of the glove box by a neutral gas current. The glove box 8 ensures the safety of the operator in the case where the reactor fractures and avoids the ignition of the reaction gases or the inhalation of the product by the operator.

The porous structure 12 to be densified is placed on a rotary or non-rotary support 14, which can also support, in contact with the porous structure, a susceptor 13 (e.g. a graphite mandrel, so as to be heatable by induction). The support is installed in the lower part of the body of the reactor 2 and traverses a plug 15 provided with an opening through which can slide said support 14. The support 14 can be rotated by a motor 16 located outside the reactor 2.

The reactor 2 is heated by an induction heating device 18 constituted by coils 20 in which can flow a high frequency current supplied by a generator 22. The temperature of the porous structure 12 is measured by temperature probes 24 incorporating thermocouples connected to a programmer making it possible to regulate the power of the generator 22 in order to control the temperature.

The reactor also has a pipe 26 for the continuous introduction of precursor into the reactor 2, a pipe 28 for injecting nitrogen or some other neutral gas for expelling the air contained in the reactor 2 and finally an orifice 30 provided with a tap located in the lower part of the reactor and permitting the emptying of the latter.

The reactor 2 is surmounted by the heat exchanger or condenser 4, which comprises a circulation coil 32 for the cooling liquid (generally water). By cooling the vapours of the precursor and the condensation thereof, the heat exchanger permits their return to the reactor 2. Moreover, the maintaining of an adequate pressure in the apparatus avoids the crystallization of the precursor at said heat exchanger.

The splash head 6 is located in the upper part of the apparatus and serves to eliminate the mist created at the reactor 2 and which would not be condensed at the heat exchanger 4. This splash head comprises a filter 34, a pressure regulating valve 36 and a reaction gas extraction pipe 38. The regulating valve 36 is connected to a pressure gauge 37, which regulates the pressure within the splash head. Finally, the splash head incorporates a reaction gas extraction pipe 38 permitting the return of the gas to a gas treatment installation 40, which is generally located outside the glove box 8.

The operating sequence permitting the densification of a porous substrate will now be described.

Operating sequence

The porous structure 12 is placed on the support 14 within the reactor 2 and then the latter is scavenged with the aid of an inert gas so as to expel any oxygen which is present in the reactor. The reactor 2 is then filled with the precursor 42 in the form of a powder or liquid, as a function of its nature. This filling takes place by means of the filling pipe 26. When trichloroborazene is used, the precursor is in powder form.

After putting into operation the cooling circuit 32 and electric power supplies, i.e. the generator 22, programmer and temperature probes 24, the porous structure temperature is raised. The pressure is fixed at $1.4 \times 10^5$ Pa by means of the pressure gauge 37.

As soon as the precursor 42 starts to melt (80° C. for trichloroborazene), the inert gas scavenging is stopped. The precursor is then in liquid form in contact with the porous structure and in solid form in the lower part of the reactor. The heating power is then increased up to the boiling and reflux of the precursor 42 which, in liquid form, penetrates the pores of the porous structure.

On reaching the cracking temperature (e.g. 600° C. for trichloroborazene), the precursor vapours 42 undergo a cracking in the porous structure 12, which leads to boron nitride deposition within the substrate pores.

Cracking specifically takes place at the hottest walls of the porous structure. When the porous structure is placed on a susceptor, the densification front is propagated within the cylindrical, porous structure towards the outer wall. When there is no susceptor or in the case of a one-piece porous structure (e.g. a plate), the densification front advances from the interior of the porous structure towards its outer walls in contact with the liquid precursor. The densification front propagates in the porous substrate during the densification process at a speed which can vary between a few tenths of a millimeter per hour and a few centimeters per hour, as a function of the maximum temperature of the sample substrate and its nature. The cracking gases pass out through the pores which have not as yet been sealed. The gases from the reaction are discharged in the upper part of the installation.

The substrate is then cooled and then undergoes a heat treatment at a temperature equal to or above 2000° C. for at least one hour, in a vacuum furnace under nitrogen (pressure equal to or above $1\times10^4$ Pa). This heat treatment makes it possible to stabilize the boron nitride relative to hydrolysis.

The densified substrates obtained after such a treatment reveal, by optical micrography in polarized light, the Maltese crosses and characteristic columnar growths, by analogy with carbon, with a rough laminar structure. This structure is the most interesting, because it makes it possible to obtain by the high temperature heat treatment (2000° C.) a structure of the graphite type.

Electron transmission microscope examinations and X-diffraction analysis confirm the existence of a good orientation of the crystallites.

The composite materials obtained have a density of approximately 1.8, a crystallite size $L_a$=50 at 100 nm, $L_c$=10 to 20 nm and an interplane distance $d_{oo2}$ between 3.33 and $3.37 \cdot 10^{-10}$ (3.33 and 3.37 Å).

The prior art has not as yet disclosed a boron nitride matrix with said graphitization state. A densified substrate production example will now be described.

EXAMPLE

The porous substrate 12 to be densified is a parallelepipedic part with a height of 10 cm, a width of 3 cm and a thickness of 1.5 cm constituted by carbon fibres woven in three directions (fibres T300, 6K, 50 A under registered trademark TORAY, 50 vol. % fibres). A temperature probe is fixed to the centre of the part. The pressure is fixed at $1.4\times10^5$ Pa by means of the pressure gauge 37. The reactor 2 used has a height of 200 mm and an internal diameter of 5 cm. The precursor is trichloroborazene.

Figure 2:
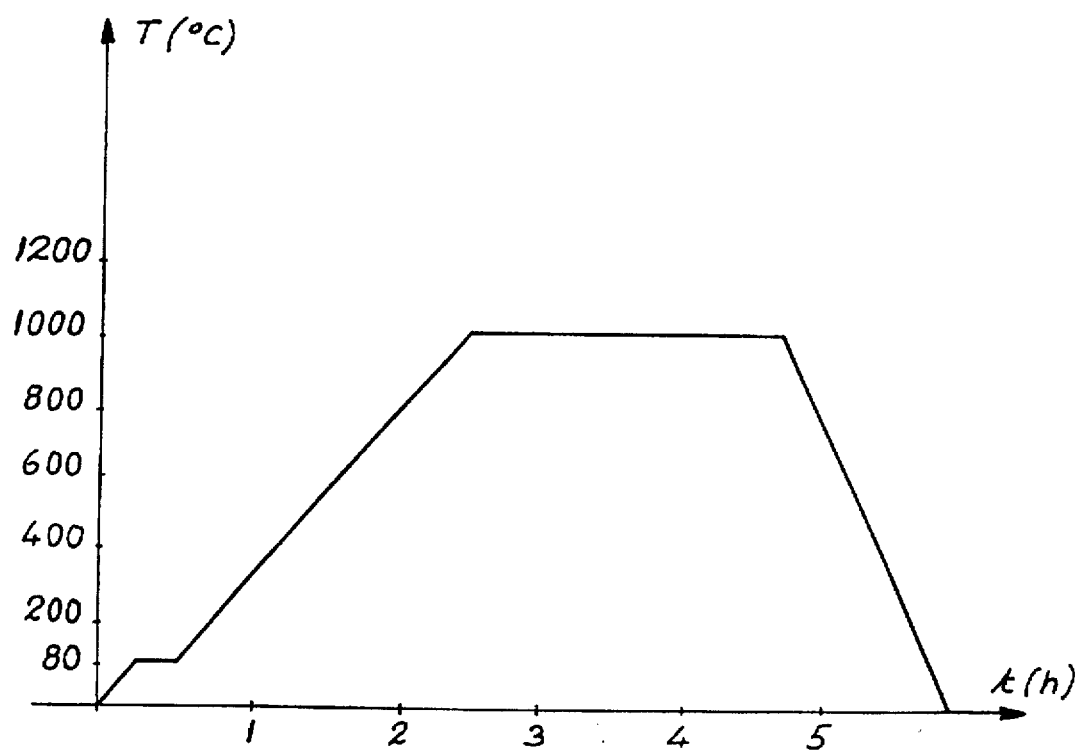
FIG. 2 A curve illustrating a thermal densification cycle as a function of time.

The heat treatment cycle is illustrated in FIG. 2. After a first plateau at 80° C. for 15 minutes, the temperature rise takes place at a rate of approximately 400° C./h up to 1000° C. Cooling then takes place at a temperature decrease rate of 800° C./h.

The part obtained undergoes a heat treatment at 2000° C. for 1 hour in a vacuum furnace. The final density of the part is approximately 1.8 and the boron nitride obtained is of the aforementioned graphite-type structure.

We claim:

1. A process for densifying a porous structure having pores by depositing boron nitride in the pores comprising the steps of:

placing said porous structure in contact with a boron nitride precursor comprising a borazene having the formula RBNH, wherein R is a halogen or hydrogen, heating said boron nitride precursor at a pressure of at least $1.2\times10^5$ Pa to a temperature of at least 600° C., and forming boron nitride by decomposing said boron nitride precursor and depositing said boron nitride in said pores of said porous structure to form a densified structure.

2. The process according to claim 1, wherein the precursor is trichloroborazene.

3. The process according to claim 1, wherein the porous structure is of carbon, alumina or boron nitride.

4. The process according to claim 1, wherein the densified structure undergoes a heat treatment at a temperature of at least 2000° C.

5. The process according to claim 1, wherein the porous structure is of graphite.

* * * * *